US007203610B2

(12) United States Patent
Tabatabaei et al.

(10) Patent No.: US 7,203,610 B2
(45) Date of Patent: Apr. 10, 2007

(54) SYSTEM AND METHOD OF OBTAINING DATA-DEPENDENT JITTER (DDJ) ESTIMATES FROM MEASURED SIGNAL DATA

(75) Inventors: Sassan Tabatabaei, Sunnyvale, CA (US); Mordechai Ben-Zeev, San Jose, CA (US); Paul Frederick Miller, San Jose, CA (US)

(73) Assignee: Guide Technology, Inc., Sunnyvale, CA (US)

( * ) Notice: Subject to any disclaimer, the term of this patent is extended or adjusted under 35 U.S.C. 154(b) by 0 days.

(21) Appl. No.: 10/930,683

(22) Filed: Aug. 31, 2004

(65) Prior Publication Data

US 2006/0047450 A1 Mar. 2, 2006

(51) Int. Cl.
*G01R 13/00* (2006.01)
*G01R 25/00* (2006.01)

(52) U.S. Cl. ............................. 702/69; 702/66; 702/79; 375/226

(58) Field of Classification Search .................. 702/69, 702/66, 67, 57, 79; 324/612, 613, 620; 375/226
See application file for complete search history.

(56) References Cited

U.S. PATENT DOCUMENTS

| | | |
|---|---|---|
| 4,757,452 A | 7/1988 | Scott et al. |
| 4,908,784 A | 3/1990 | Box et al. |
| 6,091,671 A | 7/2000 | Kattan |
| 6,194,925 B1 | 2/2001 | Kimsal |
| 6,298,315 B1 | 10/2001 | Li et al. |
| 6,356,850 B1 | 3/2002 | Wilstrup et al. |
| 6,898,535 B2 * | 5/2005 | Draving ........................ 702/69 |

OTHER PUBLICATIONS

Technical Document—*Jitter Separation-50 Mb/s To Over 40 Gb/s Using the Agilent 86100C Infiniium DCA-J*; pp. 1 through 27, Agilent Technologies, Inc., Dec. 2003.
Technical Document—*Analyzing Jitter Using a Spectrum Approach*; pp. 1 through 8; Tektronix, Inc., 2002.

* cited by examiner

*Primary Examiner*—Bryan Bui
*Assistant Examiner*—Meagan S Walling
(74) *Attorney, Agent, or Firm*—Dority & Manning, P.A.

(57) ABSTRACT

Methods for estimating data-dependent jitter (DDJ) from measured samples of a transmitted data signal include a first exemplary step of obtaining a plurality of measurements (e.g., time tags and event counts for selected pulse widths in the data signal). Such measurements may be obtained at predetermined intervals within a transmitted signal or may be obtained at randomly selected intervals, and should yield measurements for each data pulse in a repeating data pattern. An average unit interval value representative of the average bit time of the transmitted signal is determined. Time interval error estimates representative of the timing deviation from each signal edge's measured value relative to its ideal value (determined in part from the calculated average unit interval value) are also determined, as well as a classification for each measured signal edge relative to a corresponding data pulse in the repeating data pattern. DDJ delta lines are then calculated for signal edges of each pulse width in the transmitted data pattern, from which peak-to-peak DDJ values and/or estimates of duty-cycle-distortion (DCD) can be determined.

49 Claims, 9 Drawing Sheets

SYSTEM AND METHOD OF OBTAINING DATA-DEPENDENT JITTER (DDJ) ESTIMATES FROM MEASURED SIGNAL DATA

BACKGROUND OF THE INVENTION

In general, an integrated circuit refers to an electrical circuit contained on a single monolithic chip containing active and passive circuit elements. As should be well understood in this art, integrated circuits are fabricated by diffusing and depositing successive layers of various materials in a preselected pattern on a substrate. The materials can include semiconductive materials such as silicon, conductive materials such as metals, and low dielectric materials such as silicon dioxide. The semiconductive materials contained in integrated circuit chips are used to form such conventional circuit elements as resistors, capacitors, diodes and transistors.

Integrated circuits are used in great quantities in electronic devices such as digital computers because of their small size, low power consumption and high reliability. The complexity of integrated circuits ranges from simple logic gates and memory units to large arrays capable of complete video, audio and print data processing. As the semiconductor industry strives to meet technological demands for faster and more efficient circuits, integrated circuit chips and assemblies are created with reduced dimensions, higher operating speeds and reduced energy requirements. As integrated circuit signal speeds increase, timing errors and pulse width deviations within such signals may constitute a greater portion of a signal period that the signal itself.

Timing fluctuations in integrated circuits are generally referred to as "jitter". Jitter can be broadly defined in certain interpretations as the variation of a signal edge from its ideal position in time, and can be an important performance measure for integrated circuit signals, including serial links and clock signals. For serial link qualification, jitter is decomposed into its various components, which are generally divided into two types, deterministic and random. The impact of each jitter component on bit error rate (BER) performance is different.

While random jitter is unbounded and is due to sources that can only be characterized statistically, deterministic jitter is bounded and may be correlated to known sources such as supply voltage fluctuations, control-system instability, temperature variation, noise and the like. Deterministic jitter has two main contributing portions, namely periodic jitter (PJ) and data-dependent jitter (DDJ). DDJ behaves as a high-frequency jitter that is strongly correlated to a data stream's bit pattern. The main sources of DDJ in a signal are related to inter-symbol interference (ISI) and signal reflections.

ISI may typically be the result of bandwidth limitations of a transmission channel, which causes single bit information to spread into adjacent transmitted data bits. In some instances, the impact of ISI on DDJ may be affected by slew rate and/or phase distortions. Slew rate concerns the rate of change of voltage levels in a signal. Binary signals that include signal changes from a "0" bit defined by a first predefined voltage level and a "1" bit defined by a second predefined voltage level ideally have an infinite slew rate. However, bandwidth limitations of existing transmission channels result in a finite transition rate between first and second voltage levels representative of adjacent "0" bits and "1" bits, resulting in the leaking of bit information into adjacent data bits. With regard to phase distortions or group delay variations, it is noted that some channels have very fast changing phase characteristics within specific frequency ranges (often close to the pass-band to stop-band). In such cases, slight variations of data bit rate due to signal transition density, or channel parameters, can result in significant variations in bit transition edge delay.

Referring still to the different possible sources of DDJ, it should be appreciated that transmission line reflections may also contribute to DDJ in a transmitted signal. Reflection may occur on channels comprised of transmission lines with mismatched termination impedances. If mismatch exists in both ends of a transmission line, a receiver will receive a delayed and attenuated version of the transmitted signal in addition to the transmitted signal. The amount of delay and attenuation depends on the transmission line characteristics and the amount of termination mismatches.

In practical transmission channels, the primary sources of DDJ often correspond to ISI and related effects of slew rate. However, in situations where the channel consists of multiple transmission lines (e.g., including but not limited to multiple printed circuit board traces, relays, connectors, intermediate terminations, etc.), reflections and phase-distortion ISI may also become significant. Test fixtures and connectors associated with automated testing equipment may also contribute to possible signal reflections and/or phase distortion ISI.

The measurement and determination of signal jitter, including the various components thereof, is imperative in characterizing the performance of integrated circuits, especially in the production and testing stages of integrated circuit manufacturing. Various devices, including time interval analyzers, counter-based measurement devices and oscilloscopes, have been developed to measure various signal timing deviations, including jitter.

An example of a time interval analyzer that may be employed to measure high frequency circuit signals and determine various aspects of signal timing deviations is disclosed in U.S. Pat. No. 6,091,671 (Kattan), which is assigned to the present applicants' assignee, Guide Technology, Inc. The time interval analyzer disclosed in Kattan measures jitter, including total cycle-to-cycle jitter, by determining deviations between one or more of the amplitude, phase, and/or pulse width of real signal pulses and ideal signal pulses.

Other examples of time measurement devices that could be configured to measure signal timing variations are disclosed in U.S. Pat. No. 6,194,925 (Kimsal et al.) and U.S. Pat. No. 4,757,452 (Scott et al.) Kimsal et al. discloses a time interval measurement system in which a voltage differential across a hold capacitor generated between events occurring in an input signal determines the time interval between events. Scott et al. provides a system for measuring timing jitter of a tributary data stream that has been multiplexed into a higher-rate multiplex stream using pulse stuffing techniques. Scott et al. is an event counter based system that does not directly measure time intervals but determines their frequency by maintaining a continuous count of the number of pulses occurring within a signal. Still further, U.S. Pat. No. 4,908,784 (Box et al.) discloses a measurement apparatus configured to measure the time interval between two events (start and stop) through counters.

As referenced above, several devices exist for measuring signal properties, including timing variations such as total signal jitter. However, specific types of signal analysis must be applied to signal measurements in order to extract the different components of a signal (e.g., jitter signal) so that the source of jitter can be more easily characterized. U.S.

Pat. No. 6,356,850 (Wilstrup et al.) discloses features and steps for separating the components of a jitter signal, including the random and periodic components of the jitter signal. U.S. Pat. No. 6,298,315 (Li et al.) discloses features and steps for separating and analyzing the random and deterministic components of a distribution using tail-fitting steps and estimation of associated statistical confidence levels.

Although the above examples and others exist for measuring and analyzing various aspects of signal jitter, no one design exists that encompasses all features and aspects of the present invention.

All the aforementioned patents are incorporated herein by reference for all purposes.

SUMMARY OF THE INVENTION

In view of the recognized features encountered in the prior art and addressed by the present subject matter, features and steps for estimating the data-dependent jitter (DDJ) component of measured data have been developed. Varied exemplary embodiments of a system and method for obtaining DDJ measurements are hereafter presented, selected of which offer such advantages as improved robustness against low frequency periodic jitter (PJ) and accelerated measurement capability.

In one exemplary embodiment of the present invention, a method of estimating data-dependent jitter from measured samples of a transmitted signal includes a first step of obtaining a plurality of measurements (e.g., an absolute time tag and an event count relative to a reference edge) for selected signal edges within a transmitted signal. The transmitted signal typically includes a repeating data pattern characterized by a predetermined number of data pulses. The duration between adjacent measured signal edges of the transmitted signal may correspond to a predetermined event count increment such as an integer multiple of the predetermined number of data pulses in the transmitted signal plus a fixed integer value such as one. A unit interval value representative of the average bit time of the transmitted signal is determined along with time interval error (TIE) values for selected of the measured signal edges. Additional determination may be made for each measured signal edge identifying which data pulse in the known data pattern the measured edge corresponds to. A plurality of DDJ delta lines may then be computed from the TIE values. Windowing functions and windowing power loss compensation factors may also be applied to the calculated values before DDJ estimates are obtained. Peak-to-peak DDJ values and/or duty-cycle-distortion (DCD) values may be subsequently determined in part from the computed DDJ delta lines.

Another exemplary embodiment of the present subject matter corresponds to a method of estimating DDJ from random samples of a transmitted signal. Such additional exemplary embodiment includes a first step of obtaining a plurality of measurements (e.g., time tags and event counts) for a plurality of randomly selected rising edges and respective subsequent falling edges in a transmitted data signal consisting of a repeating data pattern characterized by a known sequence of rising and falling edges. A unit interval estimate representative of the average bit time for the transmitted signal may be calculated and then used to aid in computation of TIE values for each measured signal edge. Each measured signal edge is also classified into one of a plurality of predetermined groups based on the different rising and falling edges in the known data pattern. DDJ delta lines can then be computed from the TIE values for each measured edge. Peak-to-peak DDJ values and/or duty-cycle distortion can also be subsequently determined for this exemplary method.

A still further exemplary embodiment of the present subject matter relates to DDJ estimation and includes a first step of establishing a plurality of classification groups for a transmitted signal including a known repeating data pattern. The plurality of classification groups correspond to distinct groups having different d-bit preceding bit histories for a given integer value d (e.g., d=7). A plurality of measurements are obtained for selected edges of the transmitted signal at which point a time interval error value representative of the measured edge's timing deviation from an ideal value is determined. Pattern referred indices representative of the pattern edge number in the repeating data pattern that each measured edge corresponds to is also determined. Respective DDJ delta lines (and optional peak-to-peak DDJ values and/or DCD values) may then be calculated.

It should be appreciated that the present subject matter equally concerns an apparatus and system for implementing the aforementioned exemplary steps. For example, a processor circuit may be coupled to a measurement channel that obtains the signal measurements and may also be configured to perform such steps as outlined in the exemplary methods above.

In one embodiment, such a processor circuit more particularly includes a computer-readable medium for storing executable instructions corresponding to one or more of the aforementioned steps and other steps desired in the subject signal analysis. The computer-readable medium may correspond to one or more of a server database, a magnetic tape or disk, a CD-ROM, a flash or other nonvolatile memory, etc. The exact type of memory or storage medium should not be limiting to embodiments of the present invention. The processor circuit further includes a computer coupled to the readable medium that is adapted to execute the software instructions stored on the computer-readable medium.

The accompanying drawings, which are incorporated in and constitute a part of this specification, illustrate one or more embodiments of the present subject matter, and together with the description serve to explain certain principles of the disclosed technology. Additional embodiments of the present subject matter may incorporate various steps or features of the above-referenced embodiments, and the scope of the presently disclosed technology should in no way be limited to any particular embodiment. Additional objects, features and aspects of the present subject matter and corresponding embodiments are discussed in greater detail below.

BRIEF DESCRIPTION OF THE DRAWINGS

A full and enabling disclosure of the present subject matter, including the best mode thereof, directed to one of ordinary skill in the art, is set forth in the specification, which makes reference to the appended drawings, in which.

Figure 1:
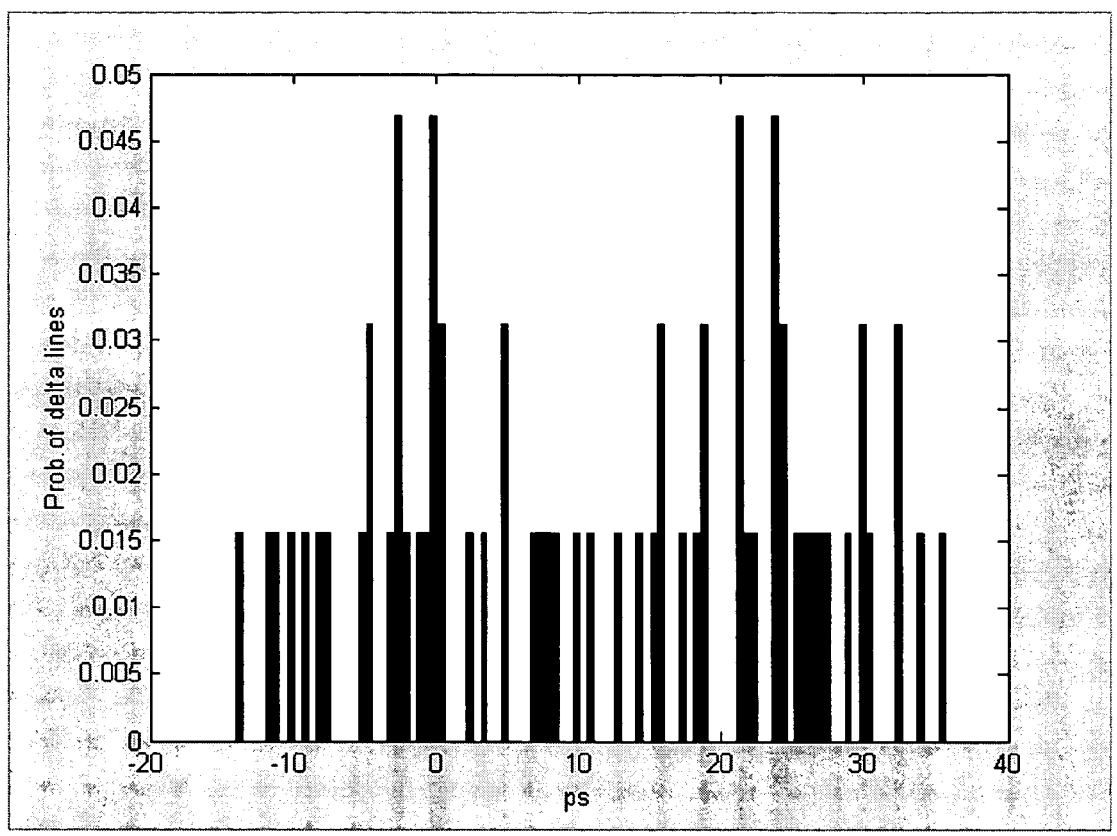
FIG. 1 provides a graphical representation of DDJ delta lines calculated for an exemplary transmitted data signal.

Repeat use of reference characters in the present specification and drawings is intended to represent same or analogous features or elements of the present subject matter.

DETAILED DESCRIPTION OF EXEMPLARY EMBODIMENTS

Reference will now be made in detail to presently preferred embodiments of the disclosed technology, one or more examples of which are illustrated in the accompanying drawings. Each example is provided by way of explanation of the present technology, not limitation of the present technology. In fact, it will be apparent to those skilled in that art that modifications and variations can be made in the present technology without departing from the spirit and scope thereof. For instance, features illustrated or described as part of one embodiment may be used on another embodiment to yield a still further embodiment. Thus, it is intended that the present subject matter covers such modifications and variations as come within the scope of the appended claims and their equivalents.

As previously mentioned, jitter is generally divided into two types, deterministic and random. Random jitter is unbounded and is due to sources that can only be characterized statistically. Deterministic jitter, on the other hand, is bounded and may be correlated to known sources such as supply voltage fluctuations, control-system instability, temperature variation, noise and the like. Deterministic jitter has two main contributing portions, namely periodic jitter (PJ) and data-dependent jitter (DDJ). One or both of inter-symbol interference (ISI) and reflections contribute to DDJ. Electrical reasons for DDJ include bandwidth limitations of the signal transmission path and/or impedance mismatch along that path. Aspects of the present invention will be generally directed to the measurement and analysis of data-dependent jitter (DDJ).

DDJ manifests itself as data-dependent shifts of the data transition edges relative to the data sampling point in the receiver. DDJ includes very high-frequency jitter components, which clock recovery circuits cannot track because most of its frequency components fall outside the receiver's clock recovery bandwidth. These variations result in shifting of a bit-error rate (BER) bathtub curve toward the sampling edge, which deteriorates the link BER performance. Although deterministic, DDJ is fully characterized by forming the histogram of DDJ-related shifts for all the edges in a data stream. Because of limited ISI depth (i.e., the number of adjacent bits affecting a specific data bit), DDJ is bounded within a range. ISI depth is a function of the transmission channel characteristics.

In many experiments that characterize or test the effectiveness of a serial communications link, data streams are transmitted that are composed of repetitions of a finite length bit pattern. In such cases, there are a finite number of DDJ-related edge shifts that can occur within the data stream signal. Therefore, a DDJ histogram, which is an estimate of the DDJ probability distribution function (pdf), will consist of separate distinct lines, called DDJ delta lines. Because ISI depth is limited, such repetitive patterns can produce a good estimate of the complete DDJ pdf as long as the pattern repetition includes all the bit combinations within the ISI depth. FIG. 1 shows the DDJ delta lines for a typical channel over which a PRBS7 pattern (a repeating Pseudo-Random Binary Sequence having a sequence length of $2^7-1=127$ bits) is transmitted. The graphical representation of FIG. 1 illustrates a discrete probability distribution estimate versus time in picoseconds.

The total jitter PDF is a result of convolving different jitter component pdf's. Therefore, each DDJ delta line results in a PDF that is a summation of scaled and shifted versions of the rest of the jitter component PDFs. Assuming the other jitter components mostly consist of normally-distributed random jitter, it can be shown that only DDJ delta lines located at the maximum and minimum of the DDJ range significantly affect the BER performance. Therefore, peak-to-peak DDJ ($DDJ_{pp}$) is used in many serial link standards to quantify DDJ. Although sufficient in some cases, peak-to-peak DDJ does not completely describe DDJ impact on BER in all cases; it is important to consider DDJ delta lines that lie close to the maximum and minimum lines, and also take into account their frequency of occurrence relative to the rest of the delta-lines. Nevertheless, $DDJ_{pp}$ is an important parameter for comparing the performance of different links.

One exemplary known method for obtaining DDJ measurements is done in the frequency domain and involves using real-time sampling oscilloscopes to digitize a repeated data pattern of a test signal. Collected samples of the test signal can provide a fairly accurate estimate of each edge location relative to a trigger time. The information relayed by the collected samples forms a time interval error (TIE) sequence, which is the difference between measured and ideal transition times. Passing the TIE sequence through a Fast Fourier Transform (FFT) operation produces a frequency domain representation of the jitter signal. In the frequency domain, components that are harmonics of the pattern repetition rate represent DDJ-related jitter. Isolating these components and using an inverse FFT operation reproduces the DDJ signal in time domain, which may be used to estimate $DDJ_{pp}$.

The above known method for estimating DDJ in a signal is fairly accurate when the pattern length of the test signal's repeated data pattern is relatively short (e.g., a pattern with 20 bits or less). For longer patterns, the energy of DDJ components is spread over many frequency bins, causing some DDJ energy to be hidden in a the noise floor of the transmitted test signal. In such cases, performing the inverse FFT will reconstruct only portions of DDJ, which may render an inaccurate estimate of $DDJ_{pp}$.

In light of the potential problems associated with the above known method and others for determining DDJ estimates for a measured signal, features and steps associated with obtaining DDJ estimates have been developed in accordance with certain embodiments of the present invention.

Figure 2:
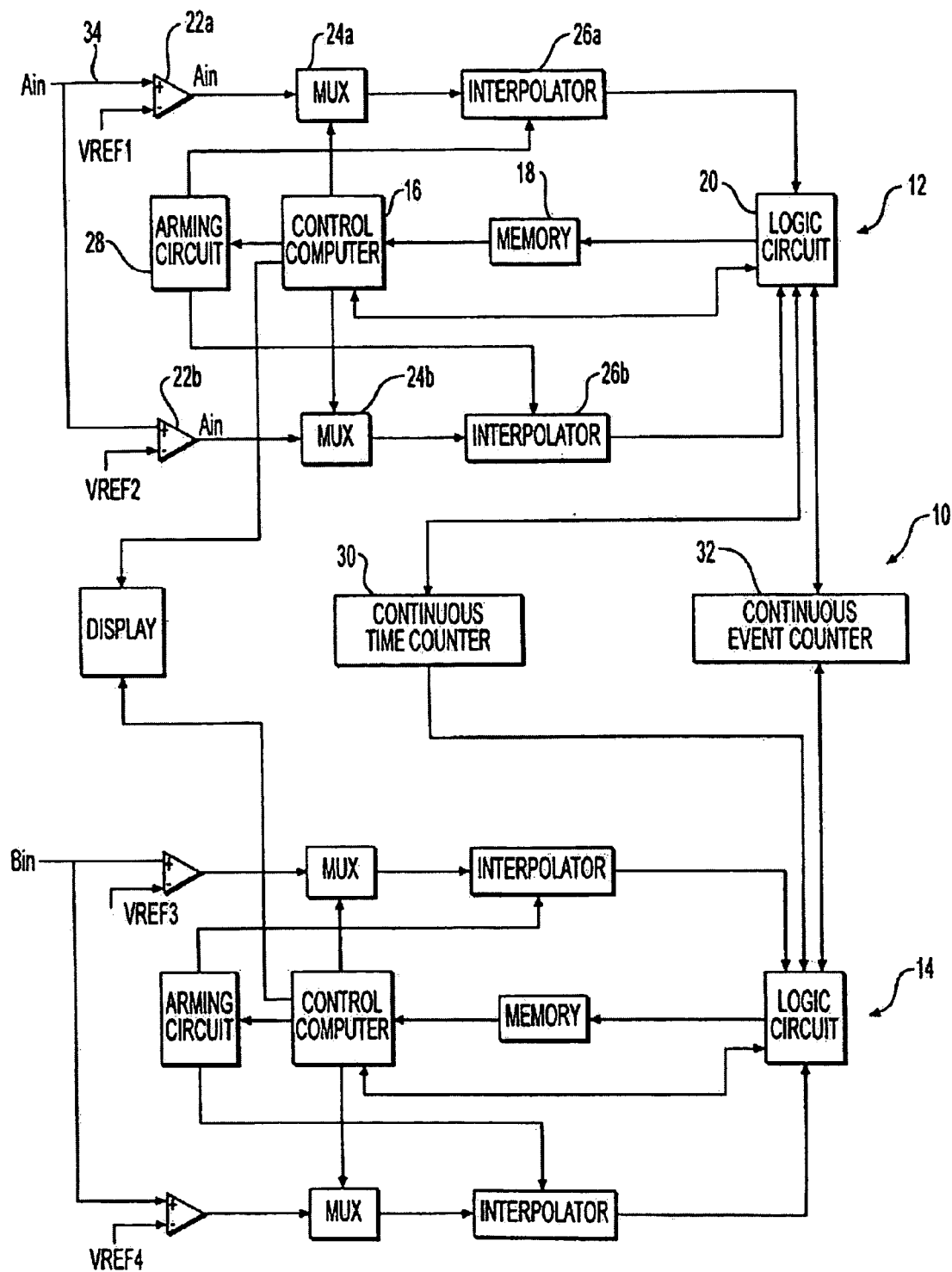
FIG. 2. provides a schematic diagram illustration of exemplary hardware components for obtaining and analyzing signal measurements to obtain DDJ estimates in accordance with aspects of the present invention.

Referring now to FIG. 2, a schematic representation of exemplary hardware components for obtaining and analyzing signal measurements in accordance with aspects of the present invention is provided. The hardware components illustrated in FIG. 2 are exemplary of those found in a FEMTO® 2000 or GT 4000 model time interval analyzer such as manufactured and sold by Guide Technology, Inc. of Sunnyvale, Calif. Although some aspects of the hardware components of FIG. 2 are discussed herein, additional discussion of these and other components of a measurement device that may be utilized in conjunction with certain aspects of the present invention are disclosed in U.S. Pat. No. 6,091,671 (Kattan), which is incorporated herein by reference for all purposes.

The time interval analyzer 10 of FIG. 2 includes two channels indicated at 12 and 14. Each channel includes a control computer 16, for example a 200 MHz DSP processor, with associated memory 18, for example a high performance FIFO memory, and logic circuit 20. Alternatively, the channels may share a common computer, memory and logic circuit, which may collectively be referred to as a processor circuit. Each channel, in turn, includes parallel measurement circuits having comparators 22a and 22b, multiplexers 24a and 24b and interpolators 26a and 26b. That is, each channel includes multiple, in this case, two measurement circuits. An arming circuit 28 is controlled by computer 16 to trigger the interpolators. A continuous time counter 30 and continuous event counter 32 provide time and event counts to both channels 12 and 14. Alternatively, each measurement circuit may have its own time counter and event counter, provided that the respective counters for each measurement circuit are synchronized.

The first measurement circuit 22a–26a/20 of each channel may be referred to as the "start" measurement circuit, while the second measurement circuit 22b–26b/20 may be referred to as the "stop" measurement circuit. Generally, time interval analyzer 10 measures characteristics of a desired signal by comparing the time and/or event measurements of the start circuit with that of the stop circuit. The particular measurement depends upon the signal selected at multiplexers 24a and 24b and upon the manner in which arming circuit 28 arms the interpolators. For example, if the start circuit passes the $A_{in}$ signal from comparator 22a as shown in FIG. 2, if the stop circuit multiplexer passes the inverse of the $A_{in}$ signal from comparator 22b, and if the interpolator 26b is armed immediately following interpolator 26a, but before the expiration of a period equal to the input signal pulse width, the difference between the time portions of the start and stop measurement tags is equal to the pulse width.

Once an interpolator has measured a signal edge, the logic circuit 20 instructs computer 16 to read the interpolator measurement from a capacitor within the interpolator whose charge or discharge is representative of a time signal that corresponds to the occurrence of the measured signal edge relative to a predetermined time reference. Computer 16 is also instructed to read the time and event counts from counters 30 and 32. It then downloads the time and event counts to memory 18, from which computer 16 retrieves the information to assign to the signal measurement. In this manner, the processor circuit correlates the measured signal edge with time and event measurements from the counters. Thus a "measurement tag" indicates the time the signal edge occurred and the edge's position within the sequence of edges.

Time interval analyzers such as the one schematically illustrated in FIG. 2 are capable of generating time interval error (TIE) data as well as absolute time tags (referenced to the first sample) for selected edges within a data stream. TIE can be generally described as the time displacement between a given signal edge (or event) and its ideal location determined from an average unit interval, or average bit time. The sampling rate of a data stream is typically much less than the bit rate for a data stream since the measurement circuitry must have an opportunity to settle and recharge (or discharge) after a given measurement to ensure the accuracy of a subsequent measurement. Since the sampling rate is lower than the bit rate, TIE data obtained by a time interval analyzer is effectively an undersampled sequence of total TIE. The undersampled TIE, however, still can be used in conjunction with the time tags to provide accurate estimates of DDJ. One method of doing so is to use TIE data directly in the time domain.

A TIE sequence may be generated by a real-time oscilloscope or time measurement device such as a time interval analyzer. The DDJ component of TIE for a specific data pattern edge is the same in different pattern repetitions because the data bit history before that pattern edge is similar for each repetition. Therefore, to estimate DDJ for a specific pattern edge, it is sufficient to collect a number of TIE samples for that edge from different pattern repetitions (i.e., by "locking" on to that specific pattern edge) and computing the sample average. The averaging reduces the contributions of random and periodic jitter on the TIE data and provides an estimate of the DDJ component. Repeating this procedure for the rest of the pattern edges provides DDJ for all the edges. This data can then be used to identify DDJ histogram delta lines or to compute $DDJ_{pp}$.

For longer data patterns measured by a time interval analyzer (typically longer than 10,000 bits), it might be somewhat time consuming to collect many samples of TIE for all pattern edges. In such cases, DDJ may be measured only for a subset of pattern edges (such as the ones that are more likely to cause maximum or minimum DDJ) in order to reduce the test time for computing $DDJ_{pp}$. Analysis of the pattern transition density may be used to identify such pattern edges. More particular aspects of such DDJ measurement technology, including multiple method and corresponding system embodiments will now be presented with respect to FIGS. 3–5.

Figure 3:
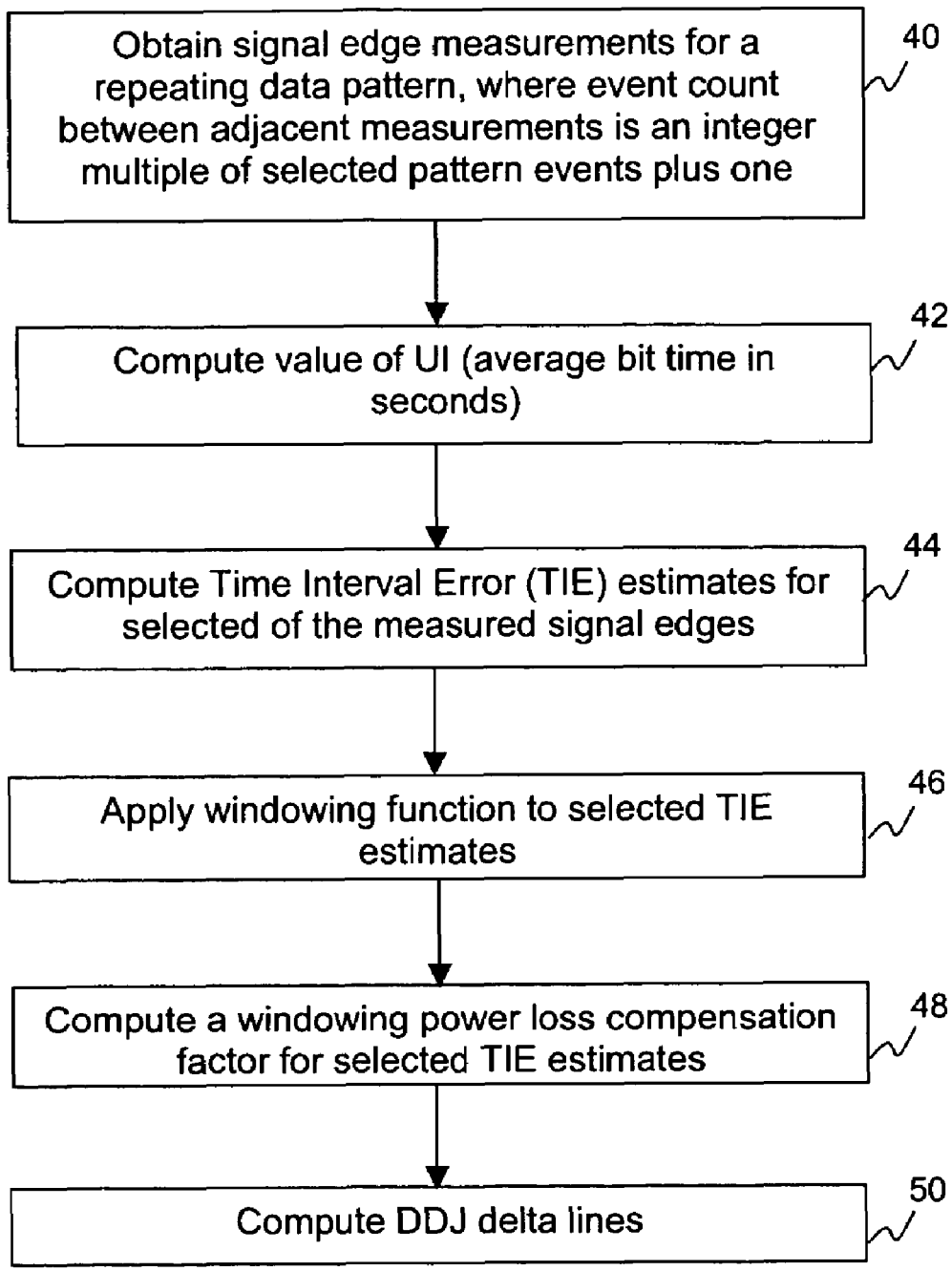
FIG. 3 provides a block diagram of exemplary steps in a first exemplary method of obtaining DDJ estimates in accordance with aspects of the present invention.

A first exemplary method for obtaining DDJ estimates for a transmitted signal provides algorithm steps based on a regular sampling methodology that uses an event counter feature of a time measurement device (e.g., a continuous time interval analyzer such as depicted in FIG. 2) to capture and classify different pattern edges in a signal. Exemplary algorithm steps for such first exemplary method for estimating DDJ are illustrated in the block diagram of FIG. 3. The signal under test (SUT) for the method of FIG. 3 is required to comprise a repeating data pattern having a finite bit length. Using such repetition helps to sample all or selected pattern edges when under-sampling the signal (i.e., having a sampling rate much less than the bit rate of the SUT), and also allows for multiple sampling of each pattern edge to help reduce the effects of other jitter components, such as random and periodic jitter.

A first step 40 in the method of FIG. 3 is to obtain a plurality of signal edge measurements in an SUT having a repeating data pattern. The data sampling of step 40 is effected such that the event count increment between the start edges of two adjacent samples is equal to an integer multiple of the number of data pulses in the data pattern plus one. In other words:

$$E(i+1)-E(i)=K \cdot ppat+1 \quad i=1,\ldots,N \quad (1)$$

where K is an integer and ppat is the number of triggerable events (or pulses) in the data pattern. This quantity is the same as the total number of rising edges or total number of falling edges in the data pattern. Further, N is the total number of samples in one iteration of the repeating data pattern and the function E(i) is defined as the event count for measured sample i. In further accordance with exemplary sampling step 40, a time interval mode that establishes what input signals and corresponding measurements to obtain is configured such that measurements are obtained for selected rising edges within a SUT and the immediately subsequent respective falling edges. Such a "pulse width" mode may be effected in a similar manner as described above with respect to FIG. 2, whereby a start measurement circuit in a given measurement channel measures a given rising edge and the stop measurement circuit in the same channel measures the immediately subsequent falling edge.

Figure 6:
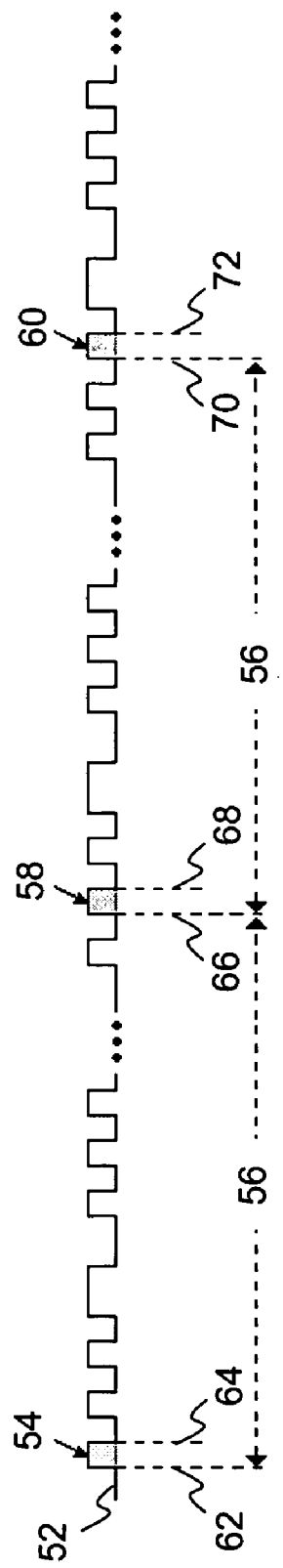
FIG. 6 provides a graphical illustration of an exemplary data signal showing start and stop edges associated with exemplary pulse width measurements obtained for a repeating data pattern in accordance with the presently disclosed technology.

An example of a data signal measured via step 40 is depicted in FIG. 6, which illustrates measured portions of a data signal 52. Signal 52 consists of a 15-bit pattern (namely, the sequence represented in binary format as [101010110010101]) that is repeatedly transmitted. Assume that a first measured pulse 54 corresponds to the first pulse in the data stream. A time duration 56 is then calculated to correspond to an event count increment determined by (1) to be 7K+1, where K is an integer value as previously described and 7 is the number of rising edges in the known 15-bit data pattern of signal 52. The value of K may often be limited to an integer having a value great enough to ensure that measurement circuitry will be fully enabled between subsequent measurements. After an event count increment defined by duration 56 has elapsed, a second pulse 58 corresponding to a copy of the second pulse in the data pattern is measured. The same event count increment represented by duration 56 is then monitored at which point a third measured pulse 60 corresponding to the third pulse in the data stream is measured. This process repeats until the fourth, fifth, sixth and seventh pulses in the data pattern are measured at which point the cycle returns to measuring the first pulse in the data pattern and so on until N total samples are obtained. It should be appreciated that although the present subject matter describes an event count increment and corresponding time delay defined as K·ppat+1, other event count increments (e.g., K·ppat+3, K·ppat+7, etc.) may also enable a measurement sweep of all pulses in the data pattern. It is within the purview of one of ordinary skill in the art to implement such variations to the event count increment between measurements.

The value of N is selected such that N=M·ppat+1, where M is an integer and indicates the number of samples that are desired per pattern edge. Multiple samples per edge are obtained and then averaged to help eliminate RJ and PJ quantities. The total sampling time ($T_{tot}$) to obtain N measurements is defined as:

$$T_{tot}=(K \cdot patLen/ppat+1)M \cdot ppat \cdot UI \quad (2)$$

where UI is the signal bit rate and patLen is the pattern length in bits. $T_{tot}$ should be at least 100 ms in some embodiments to ensure that the algorithm rejects PJ frequencies as low as 30 Hz. This may be achieved either by increasing the values for M and/or K.

Referring still to FIG. 6, for each pulse iteration, measurements of the rising and falling edges of the designated pulse may be obtained. For example, measurements of pulse 54 include a time stamp $t_r(1)$ at rising edge 62 and a time stamp $t_f(1)$ at falling edge 64. Measurements of pulse 58 may include a time stamp $t_r(2)$ at rising edge 66 and a time stamp $t_f(2)$ at falling edge 68. Measurements of pulse 60 may include a time stamp $t_r(3)$ at rising edge 70 and a time stamp $t_f(3)$ at falling edge 72. Time intervals P(i) may also be calculated to determine the time difference between a rising edge and the immediately subsequent falling edge. Such time interval essentially corresponds to the pulse width for a data pulse and is defined as $P(i)=t_f(i)-t_r(i)$. Event counts for each measured rising or falling signal edge may also be obtained in addition to each time stamp. Such measurements are obtained for N data pulses in the signal under test. It should be appreciated that the actual type of measurements obtained may correspond to such information as one of rising edges, falling edges, signal periods, pulse widths, duty cycle or any combination of such multiple measurement types.

Referring again to the methodology outlined in FIG. 3, a next step 42 in such method corresponds to computing a unit interval value (UI) representative of the average bit time in seconds for the transmitted signal. This computation can be effected in many different ways. One exemplary way for computing the average bit time in step 42 is to use the following estimate:

$$UI = \frac{t(N)-t(1)}{E(N)-E(1)} \cdot \frac{ppat}{patLen} \quad (3)$$

The estimate defined in (3) may sometimes result in slight offset, which cause long term trend in subsequent TIE estimates.

A next step 44 in the first exemplary method for estimating DDJ involves computing time interval error (TIE) estimates for all or selected pattern edges. TIE can be generally described as the time displacement between a given signal edge (or event) and its ideal location determined from an average unit interval, or average bit time. TIE sequences computed in step 44 can be grouped based on the which edge of the data pattern they correspond to, as follows:

rise1: $TIE_r(1,m)$ riseL: $TIE_r(L, m)$ m=1, ... M   (4)

fall1: $TIE_f(1,m)$ fallL: $TIE_f(L,m)$ where riseX and fallX are the set of selected rising and falling edges in the pattern and where L≦ppat.

Since TIE estimates are obtained for measured edges and grouped based on which edge in a data pattern is measured, a supplemental objective of step 44 is to determine the pattern edge that a given measurement block starts with such that all measurements in the block can be identified. Continuous time interval analyzers, such as the one depicted in FIG. 2, typically do not use a pattern trigger signal to start measurements, thus resulting in a random selection of the pattern edge at the beginning of a measurement block. For some measurements, the knowledge of the pattern edge at the beginning of a measurement block can significantly enhance the speed and/or accuracy of measurement and also enable the extraction of more jitter/timing analysis data.

Since continuous time interval analyzers do, however, track the timing and event numbers of all sampled edges, it is possible to extract the pattern edge at the beginning of the measurement block using various techniques. One exemplary such technique involves matching a portion of the received data with the known data pattern to synchronize the block to the pattern. After synchronization, TIE and patter-referred edge indices can then be more accurately computed. A pattern-referred edge index indicates the pattern edge number id(i) that each $i^{th}$ sampled edge corresponds to. Such a synchronization method typically works well, even for relatively long data patterns. However, the method can be somewhat sensitive to signal jitter contents and does require rotating the pattern multiple times to find the best match. Other methods utilize an averaged pattern interval error (PIE) estimate that can then be compared against various pattern rotations to find what pattern edge occurs at the beginning of the block. This latter method performs more robustly in some embodiments than the aforementioned synchronization method, but does not function as well for long data patterns where there may not be a sufficient number of per-edge repetitions in the sampled measurement block. It should be appreciated that specific implementation of such methods for identifying pattern edges in a measurement block should be well understood by one of ordinary skill in the art, and such a determination could be done in many specific ways while remaining within the spirit and scope of the subject invention.

Referring still to the method of FIG. 3, exemplary step 46 corresponds to calculating a windowing function w(i) which may then be multiplied by each value in the $TIE_r$ and $TIE_f$ sequences. Window scaling is used to reduced the impact of potential low frequency PJ phase randomness on DDJ estimation results. A still further processing step 48 corresponds to computing a windowing power loss compensation factor $k_w$ as follows:

$$k_w = \frac{M}{\max(|FFT(w(k))|)} \quad (5)$$

A final step 50 involves computing DDJ delta lines defined by:

$$DDJ_r(l) = \overline{TIE_r(l, m) \cdot w(m)}/k_w = \frac{1}{M \cdot k_w}\sum_{m=1}^{M} TIE_r(l, m) \cdot w(m)$$

$$DDJ_f(l) = \overline{TIE_r(l, m) \cdot w(m)}/k_w = \frac{1}{M \cdot k_w}\sum_{m=1}^{M} TIE_f(l, m) \cdot w(m). \quad (6)$$

$$l = 1, \ldots, L$$

The delta lines calculated in (6) can also be manipulated to provide a value for the peak-to-peak DDJ including DCD ($DDJ\_DCD_{pp}$) by:

$$DDJ\_DCD_{pp} = \max(\{DDJ\_DCD_r, DDJ\_DCD_f\}) - \min(\{DDJ\_DCD_r, DDJ\_DCD_f\}). \quad (7)$$

Figure 4:
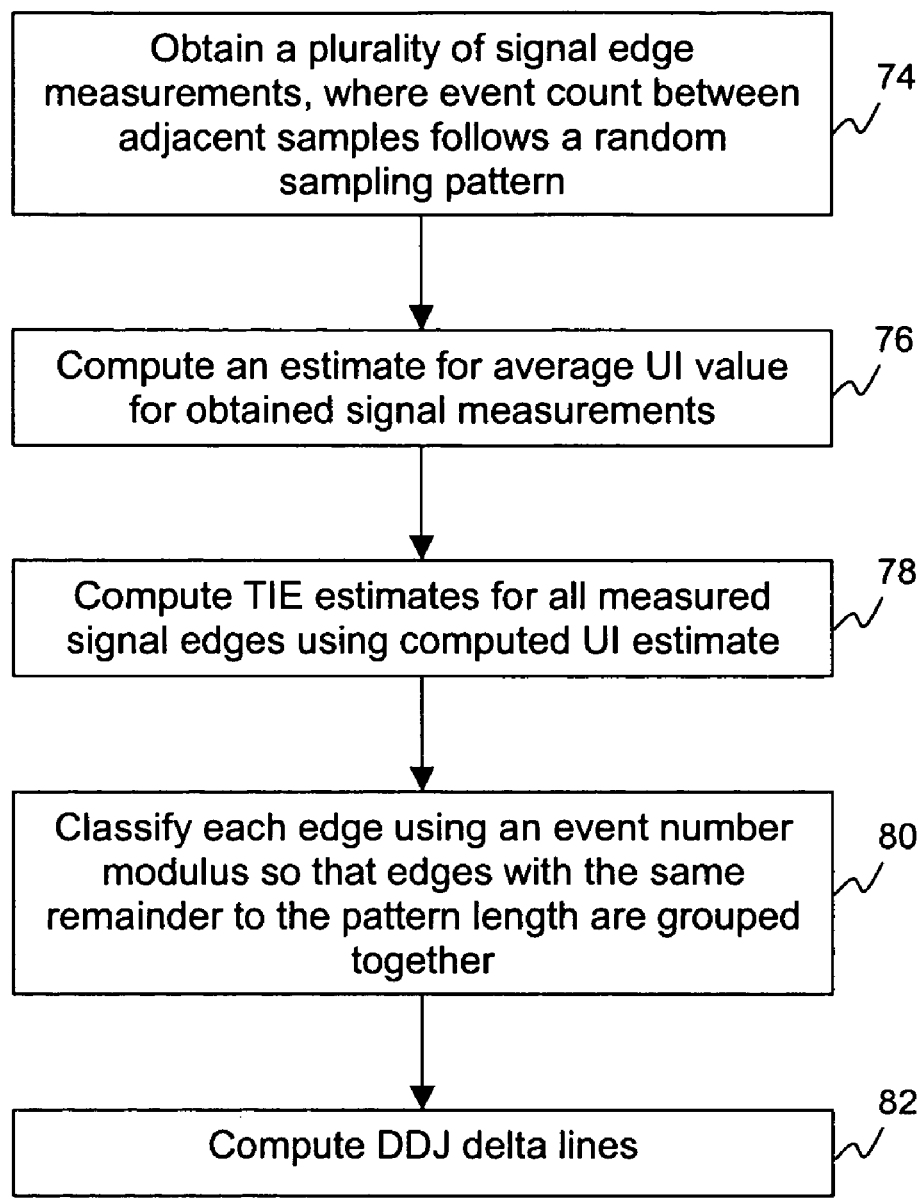
FIG. 4 provides a block diagram of exemplary steps in a second exemplary method of obtaining DDJ estimates in accordance with aspects of the present invention.

A second exemplary method of estimating DDJ in a transmitted signal will now be discussed with reference to FIG. 4, which provides a block diagram illustration of exemplary steps thereof. The embodiment represented in FIG. 4 presents a different sampling environment than that discussed in the embodiment of FIG. 3. The first exemplary method of FIG. 3 uses a regular sampling pattern with a constant event count increment between any two adjacent samples of a transmitted signal. However, other types of sampling that provide multiple samples of different pattern edges in a known repeating data pattern may also be used. For example, the methodology embodiment represented in FIG. 4 employs a random sampling environment. One advantage of random sampling over regular sampling in some embodiments is an ability to average out certain low frequency periodic jitter components and to synchronize to the data repetition rate.

Referring now to a first step 74 in the second exemplary method represented in FIG. 4, a plurality of signal edge measurements are obtained for a transmitted data signal. Measurements for each $i^{th}$ measured signal edge may include such quantities as previously described including an absolute time stamp t(i) and an event count relative to a known reference edge E(i). The transmitted data signal may correspond to a signal such as signal 52 illustrated in FIG. 6, consisting of a repeating data pattern characterized by a known sequence of rising and falling edges. The time intervals between adjacent measurements obtained in step 74 is selected randomly, such that the event count increment between adjacent samples follows a pattern defined by:

$$E(i+1) - E(i) = r(i) \; i = 1, \ldots, N \quad (8)$$

where r(i) is sequence of random integers, and N is the total number of samples. The measurement mode of the time interval analyzer or other measurement device configured to obtain the measurements in step 74 is preferably set to a "pulse width" mode, whereby respective values P(i) corresponding to the time difference between each randomly selected $i^{th}$ rising edge and the immediately subsequent falling edge are obtained.

A next step 76 in the method of FIG. 4 corresponds to computing a unit interval (UI) estimate representative of the average bit time in seconds for the transmitted signal. One particular way to compute such a unit interval estimate is to search for the event numbers E(j) and E(k) such that E(k)−E(j) is a multiple of the number of pattern edges (ppat). A unit interval value UI is then calculated from the following:

$$UI = \frac{t[k] - t[j]}{E[k] - E[j]} \frac{ppat}{patLen} \quad (9)$$

where N is the total number of samples in the arrays and the measurements for samples k and j are as described above.

A still further step 78 in the method of FIG. 4 concerns computing a time interval error (TIE) estimate for all signal edges measured in step 74 using the UI estimate computed in step 76. Such TIE estimates can be calculated in several different ways, similar to step 44 of FIG. 3. A first process for computing TIE estimates involves synchronizing the transmitted data stream with the pattern definition to extract the starting edge of the data stream, as previously described with respect to step 44 of FIG. 3. This knowledge provides an ability to predict the location of the rest of the edges in the pattern relative to the first one. TIE estimates can also be determined using pattern interval error (PIE) estimates, also as previously described with respect to step 44 of FIG. 3.

Such latter method does not require pattern synchronization, and provides the estimate of any edge timing relative to the closet repetition of the pattern reference edge. It is computed as below:

$$PIE(i) = t(i) - \left(\left[\frac{E[i] - E[1]}{ppat}\right] \cdot patLen\right) \cdot UI \quad (10)$$

where $[x]$ represents the integer part of X.

Referring still to FIG. 4, a next step 80 in the exemplary method corresponds to classifying each measured signal edge using an event number modulus ppat so that the edges with the same remainder to ppat are grouped together. Each group represents repetitions of the same pattern edge in the repeatedly transmitted data pattern. These groups are defined as follows:

$$mod(E(i)-E(1),ppat)=1 \rightarrow rise1: TIE_r(1,m_l) \text{ or } PIE_r(1, m_l)$$

$$mod(E(i)-E(1),ppat)=L \rightarrow riseL: TIE_r(L,m_L) \text{ or } PIE_r(L,m_L)$$

$$mod(E(i)-E(1),ppat)=1 \rightarrow fall1: TIE_f(1,m_l) \text{ or } PIE_f(1, m_l)$$

$$mod(E(i)-E(1),ppat)=L \rightarrow fallL: TIE_f(L,m_L) \text{ or } PIE_f(L, m_L) \quad (11)$$

where riseX and fallX are the set of selected rising and falling edges in the pattern ($L \leq ppat$).

A final step 82 in the exemplary method of FIG. 4 is to compute a plurality of DDJ delta lines. If the TIE estimates were calculated in step 78 from the TIE synchronization process, the following formula can be used:

$$DDJ_r(l) = \overline{TIE_r(l, m_l)} = \frac{1}{M_l}\sum_{m=1}^{M_l} TIE_r(l, m_l)$$

$$DDJ_f(l) = \overline{TIE_f(l, m_l)} = \frac{1}{M_l}\sum_{m=1}^{M_l} TIE_f(l, m_l) \quad (12)$$

$$l = 1, \ldots, L$$

If the PIE estimation process was used in step 78, then the equations below can be used:

$$DDJ_r(l) = rem(\overline{PIE_r(l, m_l)}, UI)$$

$$= rem\left(\frac{1}{M_l}\sum_{m=1}^{M_l} PIE_r(l, m_l), UI\right)$$

$$DDJ_f(l) = rem(\overline{PIE_f(l, m_l)}, UI) \quad (13)$$

$$= rem\left(\frac{1}{M_l}\sum_{m=1}^{M_l} PIE_f(l, m_l), UI\right)$$

$$l = 1, \ldots, L$$

where rem(X,Y) represents remainder of X divided by Y. The delta lines calculated in (12) or (13) can also be manipulated to provide a value for the peak-to-peak DDJ including DCD ($DDJ\_DCD_{PP}$) by:

$$DDJ\_DCD_{PP} = \max(\{DDJ\_DCD_r, DDJ\_DCD_f\}) - \min(\{DDJ\_DCD_r, DDJ\_DCD_f\}) \quad (14)$$

It should be noted that random sampling reduces the impact of low frequency periodic jitter on DDJ estimates.

The algorithms presented above with reference to FIGS. 3 and 4 measure edge shift for at least one of every edge in the repeatedly transmitted data pattern. Such methods work well for short patterns (less than 40 edges or so), but the test time increases significantly for relatively longer patterns. For example, total sampling time for a PRBS15 pattern with 8192 rising edges, will require sampling 2,048,000 samples. With 250 samples per pattern edge and a sampling rate of 10 μs per sample, the DDJ measurement processes set forth in FIGS. 3 and 4 take about 20.5 s. Such a measurement time is often impractical in production, especially for high volume component testing.

To speed up the DDJ measurement process, the dependence of edge shift on its immediate preceding bit history can be used. A third exemplary method, now presented with respect to FIG. 5 uses synchronization to estimate TIE for all sampled edges (as in some particular exemplary embodiments of previous steps 44 and 78). These TIE sequences are grouped together based on their preceding bit history, which is predicted from the synchronization process and knowledge of the data pattern. For example, all rising edge transitions that have a 6-bit preceding bit history of 000100 are grouped together. This is repeated for all possible 6-bit combinations. Later, the TIE estimates for the edges in one group are averaged to average out RJ/PJ effects and get accurate pattern dependent estimates of edge shift. The number of preceding bits used for grouping is referred to as "DDJ depth". A DDJ depth assumption of 7 provides good results in some embodiments, although specific DDJ depths expressed herein should not convey unnecessary limitations of the presently disclosed technology. A DDJ depth of 7 means that only a maximum of 128 edges need to be sampled regardless of the pattern length. This method limits the total sampling time to 320 ms (32 ms for 1 us/s rate), which is a significant improvement over other methods. The third exemplary method of FIG. 5 works especially well with pseudo-random bit sequences (PRBS) because different combinations of bit histories occur in the pattern with the same likelihood. This method has a tendency to average out reflection-related DDJ components because such components depend on the relation of bit rate and longer term bit history, not the immediate preceding bit history for a transition.

Figure 7:
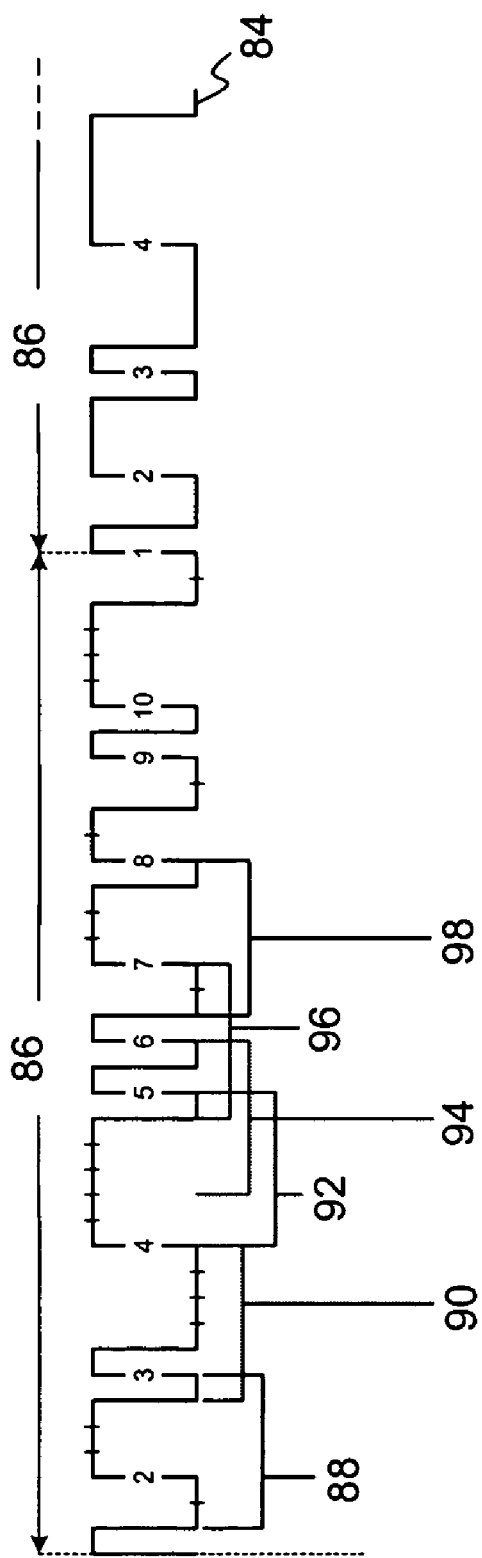
FIG. 7 provides a graphical illustration of an exemplary data signal showing 6-bit preceding bit histories for selected data bits within such signal in accordance with aspects of the presently disclosed technology.

FIG. 7 illustrates how bit history can be identified for each pattern edge and used to group different edges. Referring now to FIG. 7, a data signal 84 consists of a 39-bit repeating data pattern, namely the sequence {100111010000111110101001110110010111100}, with one copy of the data pattern repeated in each signal span 86. Signal 84 consists of ten distinct data pulses (and thus ten corresponding rising and falling edges). Each of the ten rising edges are labeled 1–10, respectively. Assuming a DDJ depth of 6, the 6-bit history for edges 3 through 8 are as follows. The 6-bit history 88 for edge 3 corresponds to k=011100, the 6-bit history 90 for edge 4 corresponds to k=000010, the 6-bit history 92 for edge 5 corresponds to k=011111, the 6-bit history 94 for edge 6 corresponds to k=010111, the 6-bit history 96 for edge 7 corresponds to k=001010, and the 6-bit history 98 for edge 8 corresponds to k=011100. For purposes of forming different identification groups based on these exemplary 6-bit histories, edges 3 and 8 can be grouped together because they the same 6-bit immediate history.

Figure 5:
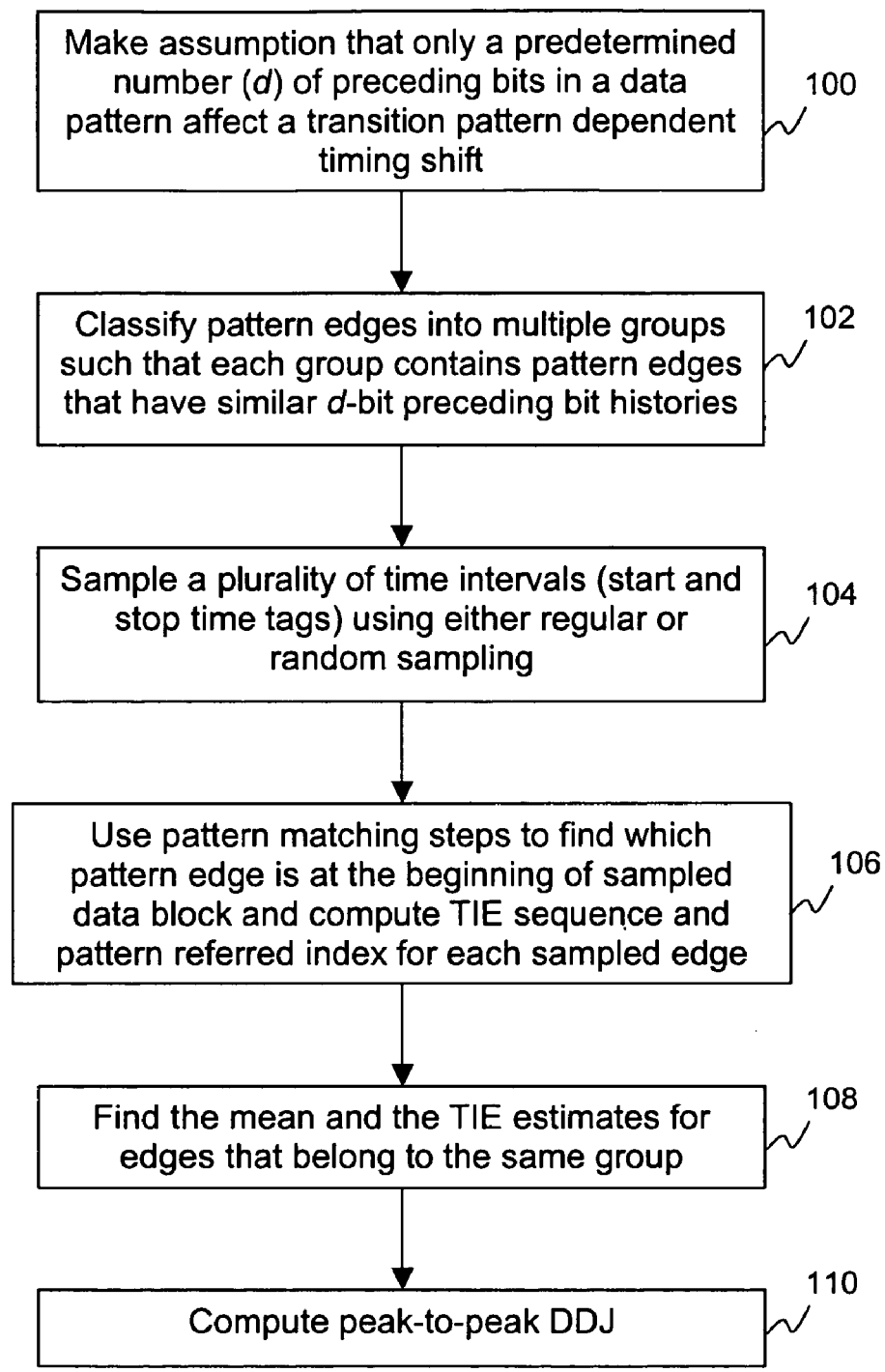
FIG. 5 provides a block diagram of exemplary steps in a third exemplary method of obtaining DDJ estimates in accordance with aspects of the present invention.

Having now described certain aspects of the signals to be measured using the third exemplary DDJ estimation method of the present technology, reference will again be directed to the block diagram representation of FIG. 5. A first step 100 in such method corresponds to determining what the DDJ pattern depth will be for the subject DDJ estimation technique. This is done by making an assumption that only a predetermined number (d) of preceding data bits in a data pattern affect a transition pattern dependent timing shift. A next step 102 corresponds to classifying the different edges in a given data pattern into multiple groups such that each group contains pattern edges that have similar d-bit preceding bit histories. For each pattern transition denoted as m(i), the different classification groups can be defined as:

$$G_k = m(i)|_{bit\ history=k} \text{ for } k=1, \ldots, 2^d \tag{15}$$

A next step 104 in the method of FIG. 5 is to sample a plurality of time intervals (corresponding to both start and stop time tags for a selected rising edge and its immediately subsequent falling edge) in a transmitted data signal such as signal 84 in FIG. 7. The signal edge sampling performed in step 104 may be effected either by regular sampling such as described in step 40 of FIG. 3 and equation (1) or by random sampling as described in step 74 of FIG. 4 and equation (8). In step 106, pattern matching techniques as generally described with reference to the synchronization procedure associated with step 44 of FIG. 3, can be used to compute the time interval error sequence [$TIE_{rise}(i), TIE_{fall}(i)$] and the pattern referred indices [$id_{rise}(i), id_{fall}(i)$] for each $i^{th}$ sampled edge. The pattern referred indices indicate the pattern edge number (e.g., one of 1–10 in the signal of FIG. 7) that each sampled edge corresponds to. For example, in a regular sampling regime, if the first sampled edge is the $7^{th}$ pattern edge, the second sampled edge will be the $8^{th}$ pattern edge, and so on such that (id(1)=7, id(2)=8, . . . ).

Referring still to FIG. 5, a next step 108 in the third exemplary DDJ estimation method corresponds to finding the mean of the TIE estimates computed in step 106 for edges that belong to the same group $G_k$. This will result in a maximum of $2^d$ pattern-dependent transition time shifts defined as:

$$DDJ(k) = \frac{1}{N_k} \sum_{i=1}^{N_k} TIE_k(i) \tag{16}$$

$$TIE_k(i) = TIE(j)|_{id(j)=k}$$

where $N_k$ is the number of elements in group $G_k$. In step 110, the peak-to-peak DDJ may be determined from the results of equation (16) by:

$$DDJ_{PP} = \max(DDJ(k)) - \min(DDJ(k)) \tag{17}$$

The DDJ estimates obtained via the three exemplary methods presented above with respect to FIGS. 3–5, respectively, provide a value that also includes any effects of duty-cycle-distortion (DCD) that may be present in a transmitted signal. DCD is another jitter component stemming from the unequal effective bit time interval for "0" and "1" bits. DCD is often due to unbalanced rise and fall time of a signal transmitter. DDJ and DCD are both considered part of deterministic jitter because they are bounded and have deterministic behavior when a transmitted data stream is known. The probability distribution function of combined DDJ and DCD is often in the form of a number of distinct delta lines, because the possible displacements of a signal edge from its ideal position in time can take a finite number of values. This can be explained by observing that DDJ+DCD for a data edge only depends on whether that edge is falling or rising and also on the sequence of a limited number of bits prior to that edge (due to limited memory of the transmission path.)

DDJ and DCD affect the key bit-error-rate (BER) performance parameter of a serial link in a similar way, and their combination is often expressed as a peak-to-peak value to quantify their effect on BER. Although the combination of DDJ+DCD is sufficient for BER estimation in most cases, such a quantity does not provide DDJ and DCD information separately, which may be needed for diagnostic purposes. As such, it should be appreciated that the present subject matter also provides steps and features for expressing DDJ and DCD as separate quantities, and thus the present invention encompasses estimation of both DDJ and DCD.

One method of extracting DCD from the DDJ estimates obtained in the above exemplary methods is to use the data found in the computed DDJ delta lines, such as determined by one of equations (7), (12) or (13), and to then subtract the averages of DDJ+DCD for rising and falling edges, i.e. using the following formula:

$$DCD = \overline{DDJ\_DCD_r} - \overline{DDJ\_DCD_f} \tag{18}$$

The DCD estimate defined by (18) is typically accurate if the sources of ISI are mostly bandwidth limitations of the transmission path as opposed to non-linearity. The estimate may also depend on the pattern selection. The most accurate estimate is obtained when a clock type pattern is used because DDJ disappears for such patterns.

Some embodiments of the exemplary methods above for measuring DDJ+DCD provide accurate results if the number of samples for each pattern edge (M) is sufficiently large to average out the effects of random and periodic jitter (RJ and PJ). Typically a value of M>50 is sufficient to provide the most accurate results, as the effect of RJ and PJ decreases by $1/\sqrt{M}$. However, if a PJ component occurs at a frequency that is synchronized with the pattern repetition rate, the DDJ measurement may be significantly affected. A remedy in such cases is to change the repeating data pattern of the test signal to eliminate the PJ/DDJ synchronization.

Figure 8:
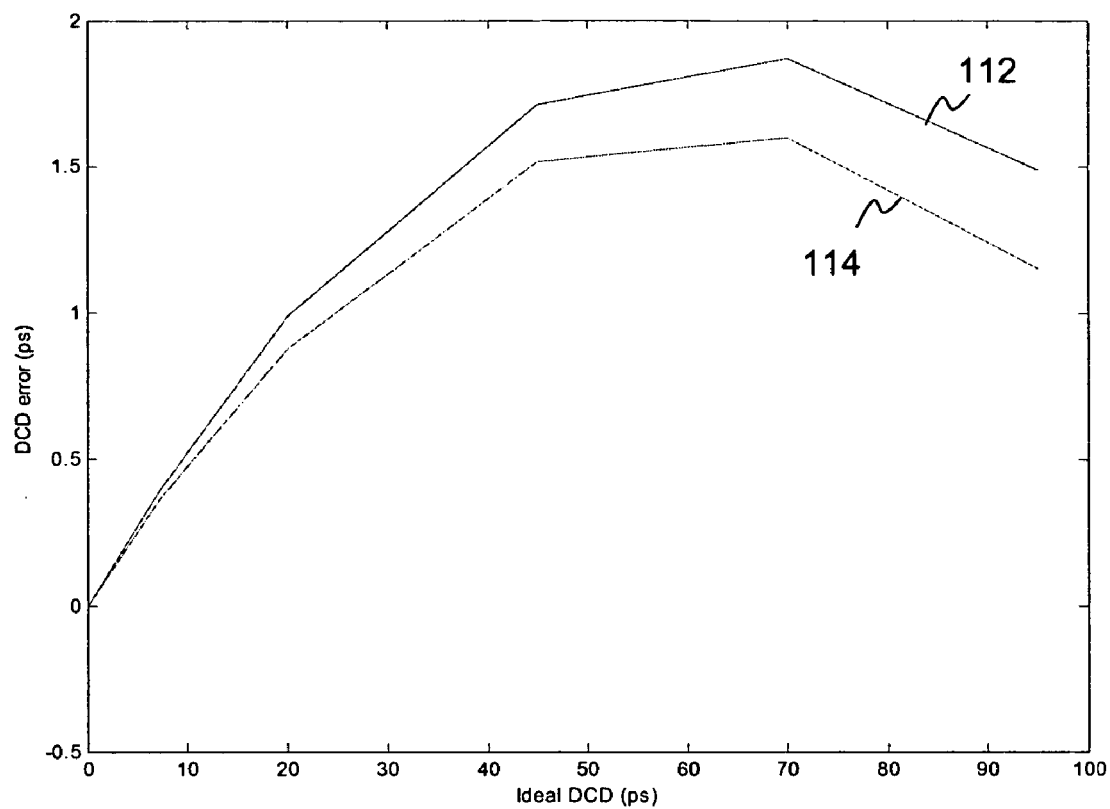
FIG. 8 provides an exemplary graphical illustration of DCD error versus ideal DCD values for two different transmitted data patterns in accordance with employing steps and features of the presently disclosed technology.

It should be further noted that the DDJ+DCD is also a function of the transmission path from the signal source to the measurement device (e.g., time interval analyzer (TIA) equipment) that obtains the signal measurements. The path impact either has to be calibrated by using a known signal at the transmitter, or be characterized through simulations. The expected error of DCD measurement for different values of DCD and two different data patterns are shown in FIG. 8. Line 112 represents the DCD error in picoseconds (ps) versus the ideal DCD in ps for a transmitted signal comprising a repeating PRBS7 data pattern, while line 114 represents the same quantities for a transmitted signal comprising a repeating K28.5 data pattern. The RJ and PJ are ignored in the representations of FIG. 8 to emphasize the effect of DDJ in estimating DCD. These results show very accurate DCD estimates are possible using the exemplary algorithms presented herein.

Figure 9A:
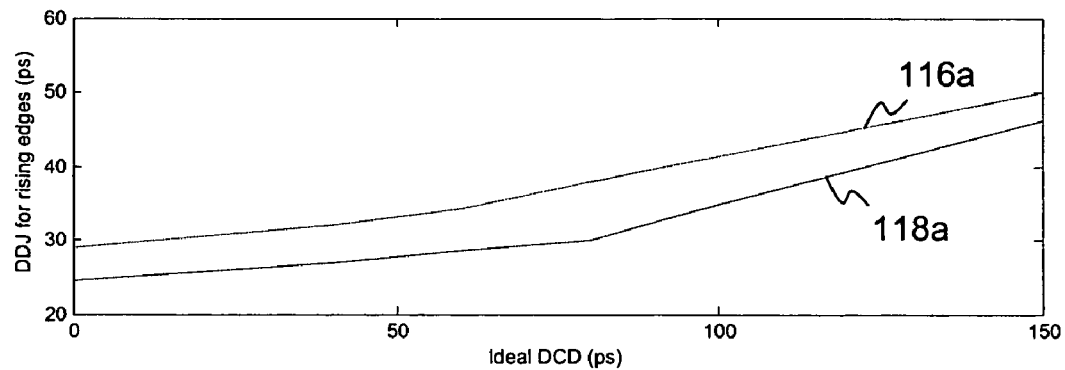
FIGS. 9A and 9B provide respective exemplary graphical illustrations of the DDJ for rising edges and falling edges versus ideal DCD for two different transmitted data patterns in accordance with employing steps and features of the presently disclosed technology.
Figure 9B:
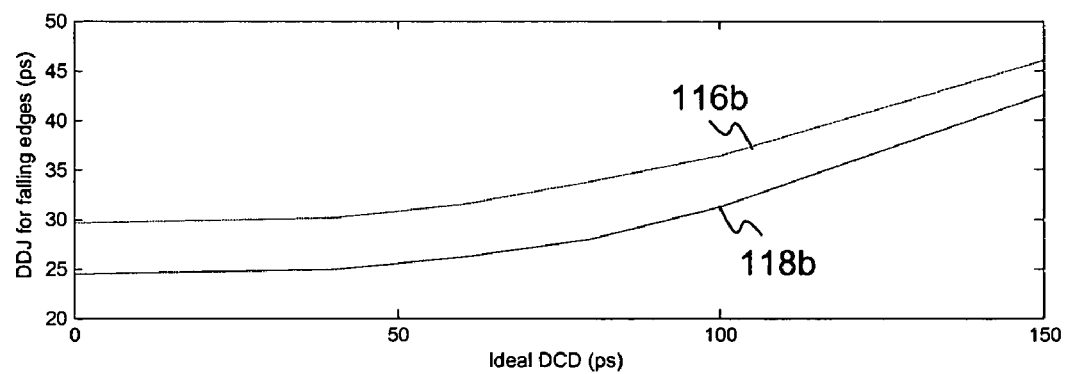

Simulations also show that DDJ and DCD interact, such that the peak-to-peak DDJ for rising edges and falling edges may not be the same. In such cases, it may be beneficial to define DDJ separately for rising edges and falling edges. An example of these separate quantities is illustrated in FIGS. 9A and 9B, respectively. FIG. 9A provides DDJ estimates versus DCD for measured rising edges in a given signal while FIG. 9B provides DDJ estimates versus DCD for measured falling edges. Signals 116a and 116b represent values for a transmitted signal comprising a PRBS7 data pattern, while signals 118a and 118b represent values for a transmitted signal comprising a K28.5 data pattern. Such DDJ estimates as illustrated in FIGS. 9A and 9B are useful for diagnostic reasons, but typically are not necessary for BER or standard compliance tests.

While the specification has been described in detail with respect to specific embodiments of the invention, it will be appreciated that those skilled in the art, upon attaining an understanding of the foregoing, may readily conceive of alterations to, variations of, and equivalents to these embodiments. These and other modifications and variations to the present invention may be practiced by those of ordinary skill in the art, without departing from the spirit and scope of the present invention, which is more particularly set forth in the appended claims. Furthermore, those of ordinary skill in the art will appreciate that the foregoing description is by way of example only, and is not intended to limit the invention.

What is claimed is:

1. A method of estimating data-dependent jitter (DDJ) from measured samples of a transmitted signal, said method comprising the following steps:
    obtaining a plurality of measurements for a plurality of selected signal edges within a transmitted signal, wherein said transmitted signal comprises a repeating data pattern characterized by a predetermined number of data pulses and wherein the duration between adjacent selected signal edges corresponds to a predetermined event count increment corresponding to an integer multiple of the predetermined number of data pulses within said repeating data pattern plus a fixed integer value greater than zero;
    determining a unit interval value representative of the average bit time of the transmitted signal;
    calculating a time or pattern interval error estimate for selected of the signal edges measured in said obtaining step;
    calculating a plurality of DDJ delta line values from the calculated time or pattern interval error estimates; and
    producing signals indicative of DDJ in measured samples.

2. The method of claim 1, wherein said fixed integer value equals one.

3. The method of claim 1, wherein said plurality of measurements obtained for each selected signal edge comprise an absolute time tag and an event count relative to a selected reference edge within the transmitted signal.

4. The method of claim 1, further comprising a step of determining for selected of the signal edges measured in said obtaining step which one of the rising or falling edges of the predetermined data pulses in said repeating data pattern the respective measured signal edges correspond to.

5. The method of claim 1, further comprising a step of applying a windowing function w(i) to the time interval error estimates TIE(i) for each $i^{th}$ measurement.

6. The method of claim 5, further comprising a step of calculating a windowing power loss compensation factor which is to be used in combination with the windowing function to calculate said plurality of DDJ delta line values.

7. The method of claim 1, further comprising a step of calculating the peak-to-peak DDJ by subtracting the minimum value of the calculated plurality of DDJ delta lines from the maximum value of the calculated plurality of DDJ delta lines.

8. The method of claim 1, further comprising a step of extracting an estimate for duty-cycle-distortion (DCD) from the calculated plurality of DDJ delta line values by subtracting the average of all DDJ delta line values calculated for falling signal edges in the repeating data pattern from the average of all DDJ delta line values calculated for rising signal edges in the repeating data pattern.

9. The method of claim 1, wherein said step of calculating a time or pattern interval error estimate for said selected of the signal edges measured in said obtaining step comprises estimating edge timing relative to the closest repetition of a pattern reference edge.

10. A measurement system configured to obtain data-dependent jitter (DDJ) estimates for a transmitted signal, said measurement system comprising:
    at least one measurement channel for obtaining multiple respective start and stop measurements for selected signal edges within the transmitted signal, wherein each start and stop measurement includes an absolute time stamp and an event count relative to a selected reference edge within the transmitted signal; and
    a processor circuit coupled to said at least one measurement channel, said processor circuit configured to determine a unit interval value for the average bit time of the transmitted signal, calculate a time interval error estimate for selected of the measured signal edges, and calculate a plurality of DDJ delta line values from the calculated time interval error estimates.

11. The measurement system of claim 10, wherein the transmitted signal comprises a repeating data pattern with a known sequence length and a known number of rising edges, and wherein said measurement system further comprises an event counter to determine an event count increment equal to an integer multiple of the known number of rising edges plus a fixed integer value, whereby the event count increment is measured by said event counter between immediately subsequent measurements obtained by said at least one measurement channel.

12. The measurement system of claim 10, wherein the plurality of respective start and stop measurements obtained by said at least one measurement channel correspond to pulse width measurements for respective selected rising edges within the repeating data pattern and the falling edges immediately following each rising edge.

13. The measurement system of claim 10, wherein said at least one measurement channel comprises a pair of comparators, multiplexers and interpolators coupled to a continuous time counter and a continuous event counter.

14. The measurement system of claim 10, wherein said processor circuit comprises:
    a computer-readable medium for storing executable instructions corresponding to the steps of determining a unit interval value for the average bit time of the transmitted signal, calculating a time interval error estimate for selected of the signal edges measured in said obtaining step, and calculating a plurality of DDJ delta line values from the calculated time interval error estimates; and
    a computer coupled to said computer-readable medium for executing the instructions stored therein.

15. The measurement system of claim 14, wherein said computer-readable medium comprises one or more of a server database, a magnetic disk or tape, a CD-ROM or DVD-ROM, and a flash or other nonvolatile memory.

16. The measurement system of claim 10, wherein said processor circuit is further configured to determine for selected of the measured signal edges which one of the rising or falling edges of the predetermined data pulses in said repeating data pattern the respective measured signal edges correspond to.

17. The measurement system of claim 10, wherein said processor circuit is further configured to apply a windowing function w(i) to the time interval error estimates TIE(i) for each $i^{th}$ measurement and to calculate a windowing power loss compensation factor which is to be used in combination with the windowing function to calculate said plurality of DDJ delta line values.

18. The measurement system of claim 10, wherein said processor circuit is further configured to calculate the peak-to-peak DDJ by subtracting the minimum value of the calculated plurality of DDJ delta lines from the maximum value of the calculated plurality of DDJ delta lines.

19. The measurement system of claim 10, wherein said processor circuit is further configured to extract an estimate for duty-cycle-distortion (DCD) from the calculated plurality of DDJ delta line values by subtracting the average of all DDJ delta line values calculated for falling signal edges in the repeating data pattern from the average of all DDJ delta line values calculated for rising signal edges in the repeating data pattern.

20. A method of estimating data-dependent jitter (DDJ) from measured samples of a transmitted signal, said method comprising the following steps:
  obtaining a plurality of measurements for a plurality of randomly selected signal edges within a transmitted signal, wherein said transmitted signal comprises a repeating data pattern characterized by a known sequence of rising and falling edges;
  computing a unit interval estimate representative of the average bit time for the transmitted signal based on the measurements from said obtaining step;
  computing a time interval error estimate for each signal edge measured in said obtaining step, wherein the respective time interval error estimates are computed in part from the computed unit interval estimate;
  classifying each measured signal edge and corresponding time interval error estimate into one of a plurality of predetermined groups corresponding to the different rising and falling edges in the known repeating data pattern;
  computing a plurality of DDJ delta line values from the computed time interval error estimates for each measured signal edge; and producing signals indicative of DDJ in measured samples.

21. The method of claim 20, wherein said step of obtaining a plurality of measurements comprises obtaining respective start and stop measurements corresponding to pulse width measurements for randomly selected rising edges in the transmitted data signal and their immediately subsequent respective falling edges.

22. The method of claim 20, wherein said plurality of signal measurements obtained for each $i^{th}$ selected signal edge comprises an absolute time tag t(i) and an event count E(i) relative to a selected reference edge within the transmitted signal.

23. The method of claim 22, wherein said unit interval estimate (UI) is computed from the following formula:

$$UI = \frac{t[k]-t[j]}{E[k]-E[j]} \frac{ppat}{patLen},$$

where ppat is the number of rising edges in the known repeating data pattern, patLen is the total number of data bits in the known repeating data pattern, and the value of E[k]−E[j] is determined to be an integer multiple of ppat.

24. The method of claim 20, wherein said step of computing a time interval error estimate for each signal edge measured in said obtaining step comprises determining which of the known sequence of rising and falling edges that comprise the known repeating data pattern correspond to the first signal edge measured in said obtaining step.

25. The method of claim 20, wherein said step of computing a time interval error estimate for each signal edge measured in said obtaining step comprises estimating edge timing relative to the closest repetition of a pattern reference edge.

26. The method of claim 20, further comprising a step of calculating a peak-to-peak DDJ value by subtracting the minimum value of the computed plurality of DDJ delta lines from the maximum value of the computed plurality of DDJ delta lines.

27. The method of claim 20, further comprising a step of extracting an estimate for duty-cycle-distortion (DCD) from the computed plurality of DDJ delta line values by subtracting the average of all DDJ delta line values calculated for falling signal edges in the repeating data pattern from the average of all DDJ delta line values computed for rising signal edges in the repeating data pattern.

28. A measurement system configured to obtain data-dependent jitter (DDJ) estimates for a transmitted signal, said measurement system comprising:
  at least one measurement channel for obtaining multiple respective start and stop measurements for randomly selected signal edges within the transmitted signal, wherein the transmitted signal comprises a repeating data pattern characterized by a known sequence of rising and falling edges; and
  a processor circuit coupled to said at least one measurement channel, said processor circuit configured to compute a unit interval estimate representative of the average bit time for the transmitted signal based on the signal edge measurements obtained by said a least one measurement channel, compute a time interval error estimate for each signal edge measurement, wherein the respective time interval error estimates are computed in part from the computed unit interval estimate, classify each measured signal edge and corresponding time interval error estimate into one of a plurality of predetermined groups corresponding to the different rising and falling edges in the known repeating data pattern, and compute a plurality of DDJ delta line values from the computed time interval error estimates for each measured signal edge.

29. The measurement system of claim 28, wherein the plurality of respective start and stop measurements obtained by said at least one measurement channel correspond to pulse width measurements for randomly selected rising edges and their immediately subsequent respective falling edges.

30. The measurement system of claim 28, wherein said at least one measurement channel comprises a pair of comparators, multiplexers and interpolators coupled to a continuous time counter and a continuous event counter.

31. The measurement system of claim 28, further comprising an event counter to determine the event count increment between randomly selected signal edges measured by said at least one measurement channel.

32. The measurement system of claim 28, wherein said processor circuit comprises:
   a computer-readable medium for storing executable instructions corresponding to the steps of computing a unit interval estimate representative of the average bit time for the transmitted signal, computing a time interval error estimate for each signal edge measured by said at least one measurement channel, wherein the respective time interval error estimates are computed in part from the computed unit interval estimate, classifying each measured signal edge and corresponding time interval error estimate into one of a plurality of predetermined groups corresponding to the different rising and falling edges in the known repeating data pattern, and computing a plurality of DDJ delta line values from the computed time interval error estimates for each measured signal edge; and
   a computer coupled to said computer-readable medium for executing the instructions stored therein.

33. The measurement system of claim 32, wherein said computer-readable medium comprises one or more of a server database, a magnetic tape or disk, a CD-ROM or DVD-ROM, and a flash or other non-volatile memory.

34. The measurement system of claim 28, wherein said processor circuit is further configured to calculate the peak-to-peak DDJ by subtracting the minimum value of the computed plurality of DDJ delta lines from the maximum value of the computed plurality of DDJ delta lines.

35. The measurement system of claim 28, wherein said processor circuit is further configured to extract an estimate for duty-cycle-distortion (DCD) from the computed plurality of DDJ delta line values by subtracting the average of all DDJ delta line values computed for falling signal edges in the repeating data pattern from the average of all DDJ delta line values computed for rising signal edges in the repeating data pattern.

36. A method of estimating data-dependent jitter (DDJ) from measured samples of a transmitted data signal, said method comprising the following steps:
   establishing an integer number d of preceding bits which are to be considered for each transmitted bit in a data signal, wherein the data signal comprises a repeating data pattern characterized by a known number of rising and falling edges;
   classifying selected possible pattern edges into one of a plurality of classification groups, wherein said plurality of classification groups correspond to distinct groups having different d-bit preceding bit histories;
   obtaining a plurality of measurements of selected edges in a transmitted version of the data signal;
   for selected of the signal edges measured in said obtaining step, determining a time interval error value representative of the measured edge's timing deviation from an ideal value and determining a pattern referred index representative of the pattern edge number in the repeating data pattern that the measured edge corresponds to;
   calculating respective DDJ delta lines by determining the mean of the time interval error values for edges that belong to each respective classification group; and
   producing signals indicative of DDJ in measured samples.

37. The method of claim 36, wherein said step of obtaining a plurality of measurements is effected such that the distance between adjacent measured signal edges corresponds to a predetermined event count.

38. The method of claim 37, wherein said predetermined event count comprises an integer multiple of the known number of rising edges in said repeating data pattern plus a fixed integer value.

39. The method of claim 38, wherein said fixed integer value equals one.

40. The method of claim 36, wherein said step of obtaining a plurality of measurements comprises obtaining respective start and stop measurements corresponding to pulse width measurements for randomly selected rising edges in the transmitted data signal and their immediately subsequent respective falling edges.

41. The method of claim 36, wherein said plurality of signal measurements obtained for each selected signal edge comprises an absolute time tag and an event count relative to a selected reference edge within the transmitted signal.

42. The method of claim 36, further comprising a step of calculating the peak-to-peak DDJ by subtracting the minimum value of the respectively calculated DDJ delta lines from the maximum value of the respectively calculated DDJ delta lines.

43. The method of claim 36, further comprising a step of extracting an estimate for duty-cycle-distortion (DCD) from the calculated plurality of DDJ delta line values by subtracting the average of all DDJ delta line values calculated for falling signal edges in the repeating data pattern from the average of all DDJ delta line values calculated for rising signal edges in the repeating data pattern.

44. A measurement system configured to obtain data-dependent jitter (DDJ) estimates for a transmitted signal, said measurement system comprising:
   at least one measurement channel for obtaining multiple respective start and stop measurements for selected signal edges within the transmitted signal;
   a processor circuit coupled to said at least one measurement channel, said processor circuit configured to establish a plurality of classification groups for a transmitted signal comprising a known repeating data pattern,
   wherein the plurality of classification groups correspond to distinct groups having different d-bit preceding bit histories for a given integer value d, for selected of the signal edges measured by said at least one measurement channel determine a time interval error value representative of the measured edge's timing deviation from an ideal value and determining a pattern referred index representative of the pattern edge number in the repeating data pattern that the measured edge corresponds to, and calculate respective DDJ delta lines by determining the mean of the time interval error values for edges that belong to each respective classification group.

45. The measurement system of claim 44, wherein the plurality of respective start and stop measurements obtained by said at least one measurement channel correspond to pulse width measurements for respective selected rising edges and their immediately subsequent falling edges.

46. The measurement system of claim 44, wherein the duration between adjacent respective start measurements obtained by said at least one measurement channel corresponds to a predetermined event count equal to an integer multiple of the number of rising edges in the known repeating data pattern plus a fixed integer value.

47. The measurement system of claim 44, wherein said at least one measurement channel comprises a pair of comparators, multiplexors and interpolators coupled to a continuous time counter and a continuous event counter.

48. The measurement system of claim 44, wherein said processor circuit comprises a computer-readable medium for storing executable instructions corresponding to the steps of establishing a plurality of classification groups for a transmitted signal comprising a known repeating data pattern, wherein the plurality of classification groups correspond to distinct groups having different d-bit preceding bit histories for a given integer value d, for selected of the signal edges measured by said at least one measurement channel determining a time interval error value representative of the measured edge's timing deviation from an ideal value and determining a pattern referred index representative of the pattern edge number in the repeating data pattern that the measured edge corresponds to, and calculating respective DDJ delta lines by determining the mean of the time interval error values for edges that belong to each respective classification group; and a computer coupled to the computer-readable medium for executing the instructions stored therein.

49. The measurement system of claim 44, wherein said processor circuit is further configured to calculate the peak-to-peak DDJ by subtracting the minimum value of the respectively calculated DDJ delta lines from the maximum value of the respectively calculated DDJ delta lines.

* * * * *